United States Patent
Ohbuchi

(10) Patent No.: US 7,046,708 B2
(45) Date of Patent: May 16, 2006

(54) SEMICONDUCTOR LASER DEVICE INCLUDING CLADDING LAYER HAVING STRIPE PORTION DIFFERENT IN CONDUCTIVITY TYPE FROM ADJACENT PORTIONS

(75) Inventor: Syuzo Ohbuchi, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 249 days.

(21) Appl. No.: 10/716,221

(22) Filed: Nov. 17, 2003

(65) Prior Publication Data

US 2004/0105475 A1    Jun. 3, 2004

(30) Foreign Application Priority Data

Nov. 28, 2002   (JP)   ............... 2002-345905

(51) Int. Cl.
*H01S 5/00* (2006.01)

(52) U.S. Cl. .................. 372/46.01; 372/46.015

(58) Field of Classification Search .............. 372/49, 372/46, 45.01; 257/103, 83
See application file for complete search history.

(56) References Cited

U.S. PATENT DOCUMENTS

| | | | | |
|---|---|---|---|---|
| 5,493,577 | A | * | 2/1996 | Choquette et al. ...... 372/46.013 |
| 6,847,054 | B1 | * | 1/2005 | DiJaili et al. ............. 257/83 |
| 2003/0013224 | A1 | * | 1/2003 | Shimizu et al. .......... 438/47 |
| 2003/0053503 | A1 | * | 3/2003 | Yang .......................... 372/45 |

FOREIGN PATENT DOCUMENTS

| | | |
|---|---|---|
| JP | 05-144744 | 6/1993 |
| JP | 05-254984 | 10/1993 |
| JP | 07-263796 | 10/1995 |
| JP | 10-107383 | 4/1998 |

* cited by examiner

*Primary Examiner*—Minsun Oh Harvey
*Assistant Examiner*—Tuan Nguyen
(74) *Attorney, Agent, or Firm*—Morrison & Foerster, L.L.P.

(57) ABSTRACT

A semiconductor laser device has a pair of cladding layers with an active layer interposed therebetween. At least one of the cladding layers is of the same composition through the entire region of the cladding layer, excluding a dopant in the cladding layer, and has a stripe portion different in conductivity type from adjacent portions.

10 Claims, 5 Drawing Sheets

RELATION BETWEEN C DOPE CARRIER CONCENTRATIONS
AND CRYSTAL GROWTH TEMPERATURES

690°C GROWTH, TMG=2×$10^{-4}$,
AsH3=12×$10^{-4}$, DMZ=2×$10^{-7}$
MF

RELATION BETWEEN Zn DOPE CARRIER CONCENTRATIONS
AND CRYSTAL GROWTH TEMPERATURES

RELATION BETWEEN H2Se DOPE CARRIER CONCENTRATIONS
AND CRYSTAL GROWTH TEMPERATURES

RELATION BETWEEN SiH4 DOPE CARRIER CONCENTRATIONS
AND CRYSTAL GROWTH TEMPERATURES

RELATION BETWEEN GeH4 DOPE CARRIER CONCENTRATIONS AND CRYSTAL GROWTH TEMPERATURES

SEMICONDUCTOR LASER DEVICE INCLUDING CLADDING LAYER HAVING STRIPE PORTION DIFFERENT IN CONDUCTIVITY TYPE FROM ADJACENT PORTIONS

BACKGROUND OF THE INVENTION

1. Field of the Invention

The present invention relates to a semiconductor laser device necessary for fiber optics communications, optical measuring systems, or optical information processing such as optical disks, and more particularly to a semiconductor laser device characterized by a channel portion and a current narrowing portion (that is, a channel structure).

2. Description of the Background Art

Semiconductor lasers require channel portions serving as a current narrowing structure to be fabricated in semiconductor. Such a structure includes a ridge structure. To form a ridge structure, it has been necessary to fabricate a striped pattern mask on a wafer, form a ridge structure portion by dry-etching or wet-etching, then perform a process operation of removing the pattern mask for etching, and thereafter perform crystal-growth of a current narrowing portion. Moreover, this method has inevitably increased the costs due to the channel forming operation and regrowth as wet-etching or dry-etching has been used. In addition, there have been problems such as characteristic variations between the steps and characteristic variations due to regrowth.

Structures different from the one described above includes a channel buried structure, in which a current narrowing layer is etched in a striped manner, followed by regrowth of a channel portion. In this case, the operation flow itself is similar to that in the ridge structure, thereby leading to the similar problems.

Still another structure includes a method of forming a channel by ion implantation. This structure has also required fabrication of a striped pattern mask, an operation of ion implantation, and a subsequent operation of removing the pattern mask. Moreover, this structure has increased the cost due to the channel forming operation and caused characteristic variations due to the variations between the steps.

Japanese Patent Laying-Open No. 7-263796 discloses a method of forming a channel portion using a substrate that is partially inclined. This structure has also required fabrication of a striped pattern mask on a wafer, etching of the substrate, and the subsequent operation of removing the pattern mask. Moreover, this structure has inevitably increased the costs resulting from the operations and increased variations between the steps, though there is no need for regrowth. In addition, since this structure has a non-flat crystal growth surface of a laser chip, there has been a need to correct inclination of laser light in packaging, which makes the packaging difficult.

Japanese Patent Laying-Open No. 10-107383 discloses a semiconductor laser device having a waveguide formed by crystal growth with light partially radiating on a substrate. The operation of forming and removing a pattern mask is not necessary in manufacturing this semiconductor laser device. A flat crystal growth layer, however, cannot be obtained since crystal is grown only on a light irradiated portion.

Japanese Patent Laying-Open No. 5-254984 discloses a method of forming a semiconductor thin film by applying high-power laser light on a substrate to melt the substrate and by causing the laser light to decompose and diffuse a dopant. Although this method also requires no operation of forming and removing a pattern mask, a flat crystal growth layer cannot be obtained.

Japanese Patent Laying-Open No. 5-144744 discloses a method of forming a semiconductor thin film by introducing a doping gas material while applying laser light on a substrate to form a temperature distribution. In this forming method, however, there is no specific description as to what range on the substrate should be irradiated with laser light and how the resultant semiconductor device is structured.

SUMMARY OF THE INVENTION

The present invention is made in light of such conditions described above. The object of the present invention is to provide a highly reliable semiconductor laser device with good electrical and optical characteristics in which a channel portion and a current narrowing portion constituting a channel structure can be manufactured easily and the manufacturing costs can be reduced considerably.

A semiconductor laser device in accordance with the present invention has a pair of cladding layers with an active layer interposed therebetween, wherein at least one of the cladding layers is of the same composition through an entire region of the cladding layer, excluding a dopant in the cladding layer, and has a stripe portion different in conductivity type from adjacent portions.

Preferably, the stripe portion different in conductivity type from adjacent portions forms a channel portion or a current narrowing portion.

Preferably, when the stripe portion different in conductivity type from adjacent portions is formed in each cladding layer, the stripe portions are opposed to each other with the active layer interposed therebetween.

Preferably, when the cladding layer is formed of two layers of separate inner and outer layers, the stripe portions different in conductivity type from adjacent portions are opposed to each other with both of the active layer and the inner layer of the cladding layer interposed therebetween.

Preferably, the stripe portion different in conductivity type from adjacent portions is formed by using at least two carrier material gases having different absorption rates into the cladding layer at a prescribed temperature and different conductivity types, and by creating a temperature distribution of crystal growth temperatures for the cladding layer.

Preferably, the temperature distribution is created by laser radiation in the form of a stripe portion.

Preferably, the temperature distribution is created by scanning with laser light.

Preferably, all layers in the semiconductor laser device are flat.

In the semiconductor laser device in accordance with the present invention, the semiconductor laser device structure as described above can be fabricated in a single crystal growth by utilizing the difference in absorption rate of carrier material gas depending on the crystal growth temperature, without forming or etching a pattern mask for forming a channel portion and a current narrowing portion. Therefore, the costs and characteristic variations can be reduced. Furthermore, the layers constituting the semiconductor laser device are flat, which makes the packaging operation easy.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1A shows a state after deposition of a p-cladding layer, FIG. 1B shows a state in which a channel portion and a current narrowing portion are formed with laser light radiation, and FIG. 1C shows a completed state.

FIG. 2A shows a state in which a channel portion and a current narrowing portion are formed with an n-cladding layer irradiated with laser light, FIG. 2B shows a state in which a channel portion and a current narrowing portion are formed with a p-cladding layer irradiated with laser light, and FIG. 2C shows a completed state.

DESCRIPTION OF THE PREFERRED EMBODIMENTS

<Basic Structure>

Figure 1A:
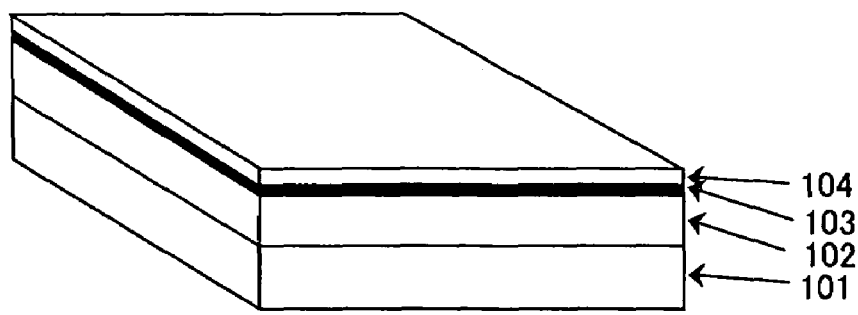
FIGS. 1A–1C are perspective views showing a stacked structure of a semiconductor laser device during crystal growth, where

A semiconductor laser device of the present invention has a basic structure including a pair of cladding layers (an n-cladding layer 102 and p-cladding layers 104, 105, 107) stacked on a substrate 101 with an active layer 103 interposed therebetween. Here, any substrate may be used as long as it is known as a substrate for a semiconductor laser device, including, for example, GaAs, AlGaInP, GaP, GaInP, InP, GaAsP, GaN, Si, SiC, sapphire substrates. These substrates may contain a variety of dopants.

The active layer is a region where a waveguide allowing stimulated emission and external radiation of laser light is formed and may have a multiple quantum well structure. Any active layer may be employed without limitation as long as it is a conventionally known active layer. The active layer is deposited in such a manner that it is interposed between a pair of cladding layers described later.

It is noted that although the semiconductor laser device of the present invention has a basic structure formed of the substrate and the layers described above, another layer may be deposited without departing from the scope of the present invention. Such layers include, for example, an n-semiconductor layer, a p-semiconductor layer, a contact layer, an insulating layer, a variety of electrodes, and the like.

The semiconductor laser device of the present invention is characterized in that all the layers in the device are flat. Here, "flat" means that there is no convex/concave or step of 0.5 µm or more on the surface of the crystal growth side of the semiconductor laser device. This greatly facilitates the packaging operation.

<Cladding Layer>

The cladding layer of the present invention is formed of a pair of semiconductor layers, with the active layer interposed therebetween, having an action of confining carriers and light. In accordance with the present invention, at least one of the cladding layers is of the same composition through the entire region of the cladding layer, excluding a dopant within the cladding layer, and has a stripe portion different in conductivity type from adjacent portions. Since the composition excluding the dopant is the same through the entire region of the cladding layer, the cladding layer of the present invention can be formed very easily. It is noted that the cladding layer may be formed of separate inner and outer layers as desired.

<Stripe Portion Different in Conductivity Type from Adjacent Portions>

In accordance with the present invention, a stripe portion different in conductivity type from adjacent portions is formed in the aforementioned cladding layer. Such a stripe portion different in conductivity type from adjacent portions can be formed of two or more parts as desired. Here, the term "different in conductivity from adjacent portions" means, for example, that if a portion adjacent to a stripe portion is of n-type, the stripe portion is of p-type. On the contrary, if the conductivity type of the adjacent portions is p-type, the stripe portion is of n-type. The stripe portion different in conductivity type from adjacent portions forms a channel portion or a current narrowing portion (a so-called channel structure). Preferably, the stripe portions may be opposed to each other with the active layer interposed therebetween. When a cladding layer is formed of separate inner and outer layers, the stripe portions can be formed such that they are opposed to each other with both of the active layer and the inner layer of the cladding layer interposed therebetween. When such a stripe portion different in conductivity type from adjacent portions is formed in the cladding layer, the permissible range of the carrier concentration in the current narrowing portion is advantageously extended, which facilitates the fabrication. When the stripe portions are formed opposed to each other as described above, the operating current value for the laser can be lower, although the permissible range of the carrier concentration in the current narrowing portion is reduced, making the fabrication difficult.

The stripe portion different in conductivity type from adjacent portions can be formed by using two or more carrier material gases having different absorption rates into the cladding layer at a prescribed temperature and having different conductivity types, and by creating a temperature distribution of crystal growth temperatures for the cladding layer. The aforementioned temperature distribution can be created by laser radiation in the form of a stripe portion and preferably created by scanning with laser light. This eliminates the need for a pattern forming step and allows formation of a channel portion or a current narrowing portion in a single crystal growth process, thereby significantly reducing the manufacturing costs and preventing semiconductor characteristic variations between products.

In the following, the present invention will be described in more detail based on Examples. The present invention, however, is not limited thereto.

EXAMPLE 1

Figure 1B:
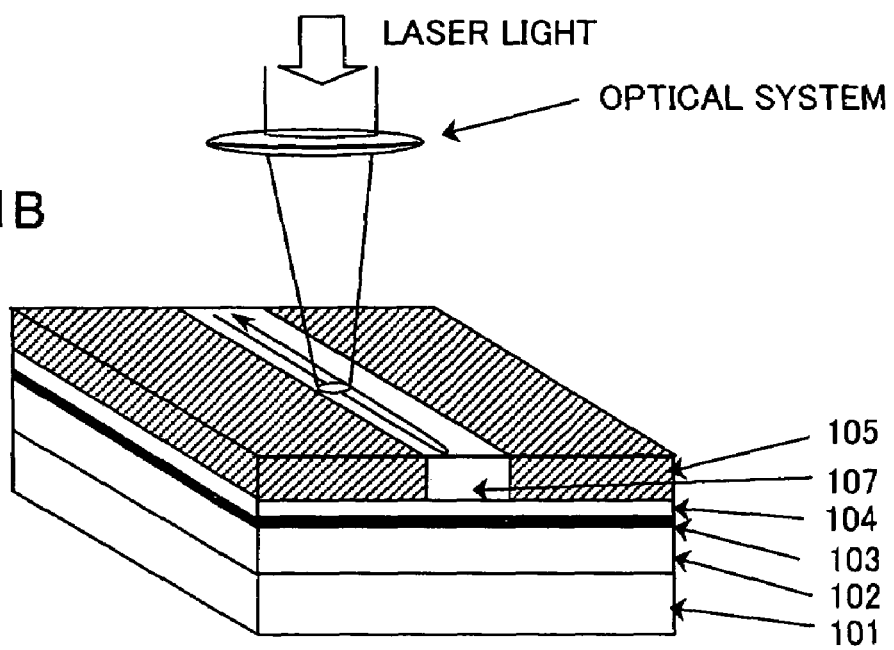
Figure 1C:
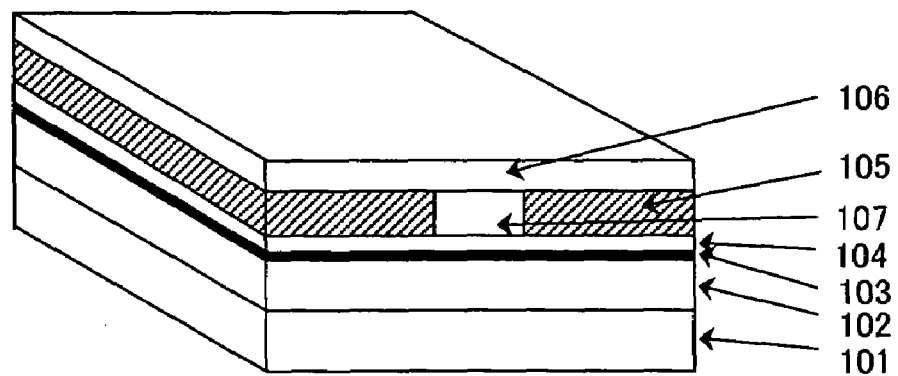

Example 1 will be described with reference to FIGS. 1A–1C. FIGS. 1A–1C are perspective views showing a stacked structure of a semiconductor laser device during crystal growth, including a substrate 101, an n-cladding layer 102, an active layer 103, a p-cladding layer 104 (an inner layer of the cladding layer), a current narrowing portion 105, a p-semiconductor layer 106, and a stripe portion 107 different in conductivity type from adjacent portions and forming a channel portion (a current path). It is noted that a cladding layer (an outer layer of the cladding layer) formed on the outer side of p-cladding layer 104 is constituted with current narrowing portion 105 and stripe portion 107 having a conductivity type different from that in the adjacent portions.

Substrate 101 is n-type GaAs doped with Si ($2\times10^{18}$ $cm^{-3}$). Crystal growth of each layer of the semiconductor laser device was performed on this substrate. The temperature in crystal growth was set at 600–800° C. For n-cladding layer 102, using trimethyl gallium (TMG), arsine and trimethyl aluminum (TMA), and further using $H_2Se$ as a carrier gas, an n-type $Al_xGa_{1-x}As$ (X=0.5) layer with a carrier concentration of approximately $1\times10^{18}$ $cm^{-3}$ was deposited to a thickness of approximately 1 µm. For active layer 103, using trimethyl gallium (TMG), arsine and trimethyl aluminum (TMA), a non-doped $Al_xGa_{1-x}As$ (X=0.14) layer was deposited to a thickness of approximately 80 nm (a multiple quantum well structure is possible). For p-cladding layer 104, using trimethyl gallium (TMG), arsine and trimethyl aluminum (TMA), a p-type $Al_xGa_{1-x}As$ (X=0.5) layer doped with C (carbon) at V/III ratio=30 with a carrier concentration of $7\times10^{17}$ $cm^{-3}$ was deposited to a thickness of about 0.3 µm (FIG. 1A).

For current narrowing portion 105, using trimethyl gallium (TMG), arsine and trimethyl aluminum (TMA) similar to p-cladding layer 104, crystal growth was performed with a supply of carrier material gas $H_2Se$ under the same growth condition as p-cladding layer 104 at V/III=30, so that an $Al_xGa_{1-x}As$ (X=0.5) layer of the same composition as p-cladding layer 104 was formed at a thickness of approximately 1.2 µm. Here, the substrate (p-cladding layer 104) was partially heated by being scanned and irradiated with laser light in the shape of the channel portion (stripe portion 107 different in conductivity type from adjacent portions), whereby a p-type portion was formed (FIG. 1B).

Figure 3:
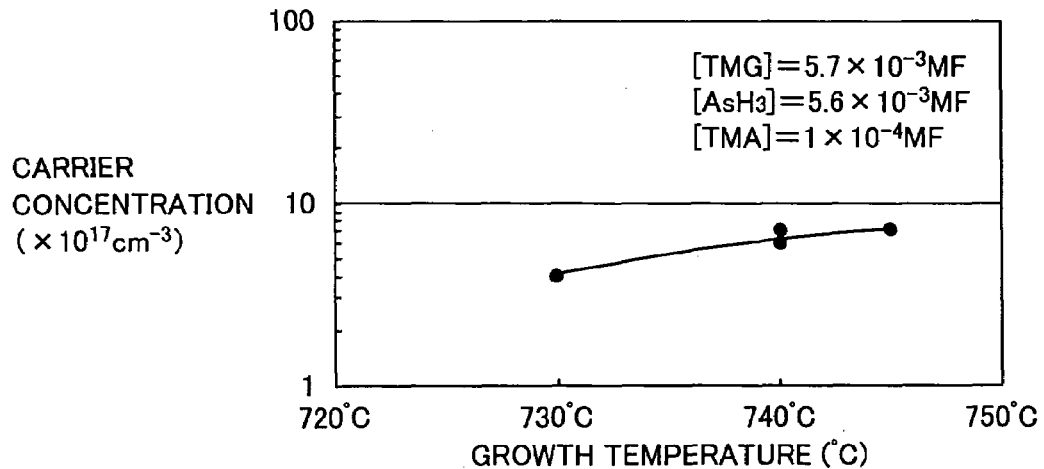
FIG. 3 is a graph showing the relation between carrier concentrations of C (carbon) dope and crystal growth temperatures.
Figure 5:
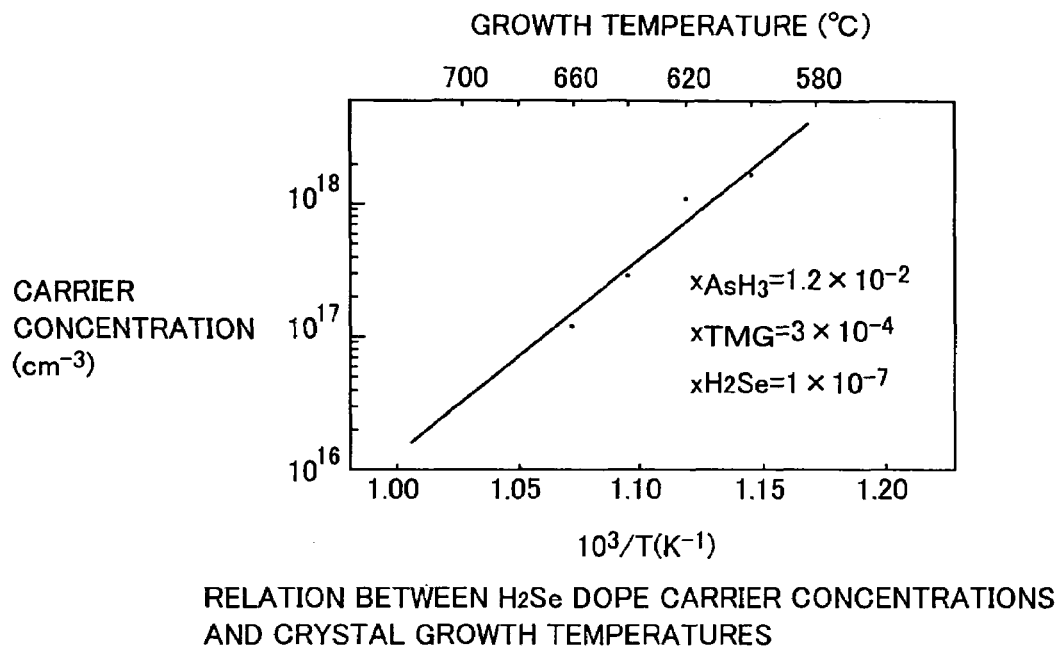
FIG. 5 is a graph showing the relation between carrier concentrations of $H_2Se$ dope and crystal growth temperatures.

The conditions under which current narrowing portion 105 is grown will now be described in more detail. First, epitaxial growth was performed at a V/III ratio of 30, resulting in p-type carrier concentration in a low-temperature growth portion. Here, the carrier acting as p-type is C (carbon) derived from the aforementioned TMG. As shown in FIG. 3, in the case of C dope, the p-type carrier concentration is higher with a higher growth temperature. (It is noted that FIG. 3 is a graph showing the relation between carrier concentrations represented on the axis of ordinate and crystal growth temperatures on the axis of abscissa.) The carrier material gas $H_2Se$ supplied during the growth of the current narrowing portion is characterized in that the n-type carrier concentration becomes lower with a higher growth temperature, as shown in FIG. 5. (It is noted that FIG. 5 is a graph showing the relation between carrier concentrations represented on the axis of ordinate and crystal growth temperatures on the axis of abscissa.) These characteristics allow the crystal growth with a temperature difference between the channel portion and the current narrowing portion, that is a temperature distribution, whereby p-type and n-type parts can be separately formed. Therefore, while crystal growth was performed in current narrowing portion 105 at a temperature that results in n-type with a carrier concentration of approximately $1\times10^{18}$ $cm^{-3}$, the temperature at the channel portion (stripe portion 107 different in conductivity type from adjacent portions) was increased by laser radiation by 10–100° C., so that the p-type portion with a carrier concentration of approximately $1\times10^{18}$ $cm^{-3}$ was formed. Accordingly, stripe portion 107 different in conductivity type from adjacent portions could be formed at a time.

Then, after a p-GaAs layer was grown as p-semiconductor layer 106 using trimethyl gallium (TMG) and arsine, a series of crystal growth processes were completed. The semiconductor layer device of the present invention as shown in FIG. 1C was thus manufactured.

Example 2

Figure 4:
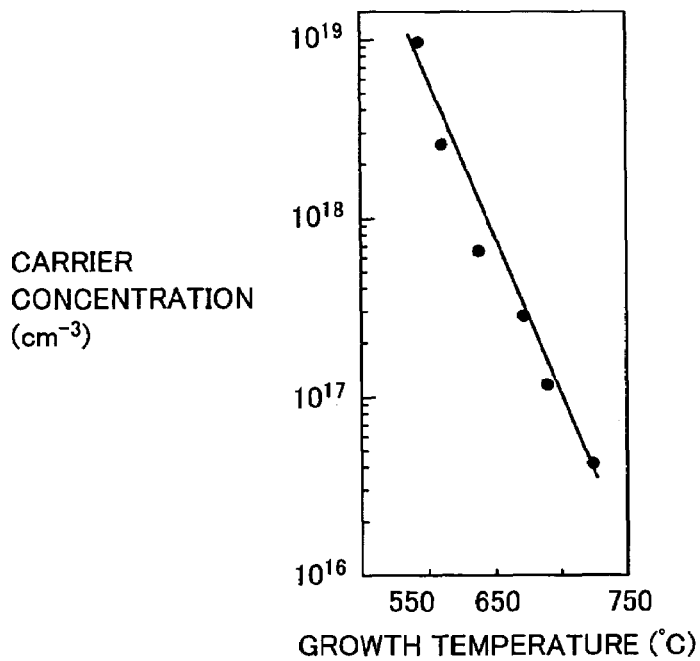
FIG. 4 is a graph showing the relation between carrier concentrations of Zn dope and crystal growth temperatures.
Figure 6:
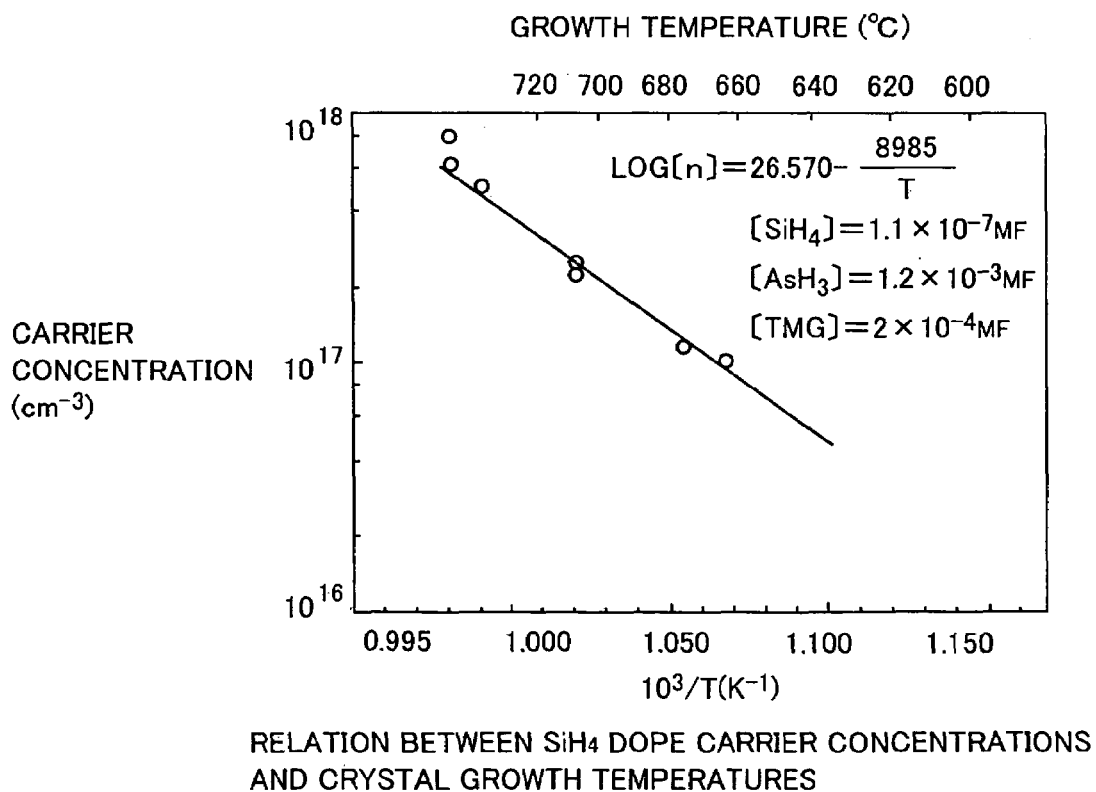
FIG. 6 is a graph showing the relation between carrier concentrations of $SiH_4$ dope and crystal growth temperatures.
Figure 7:
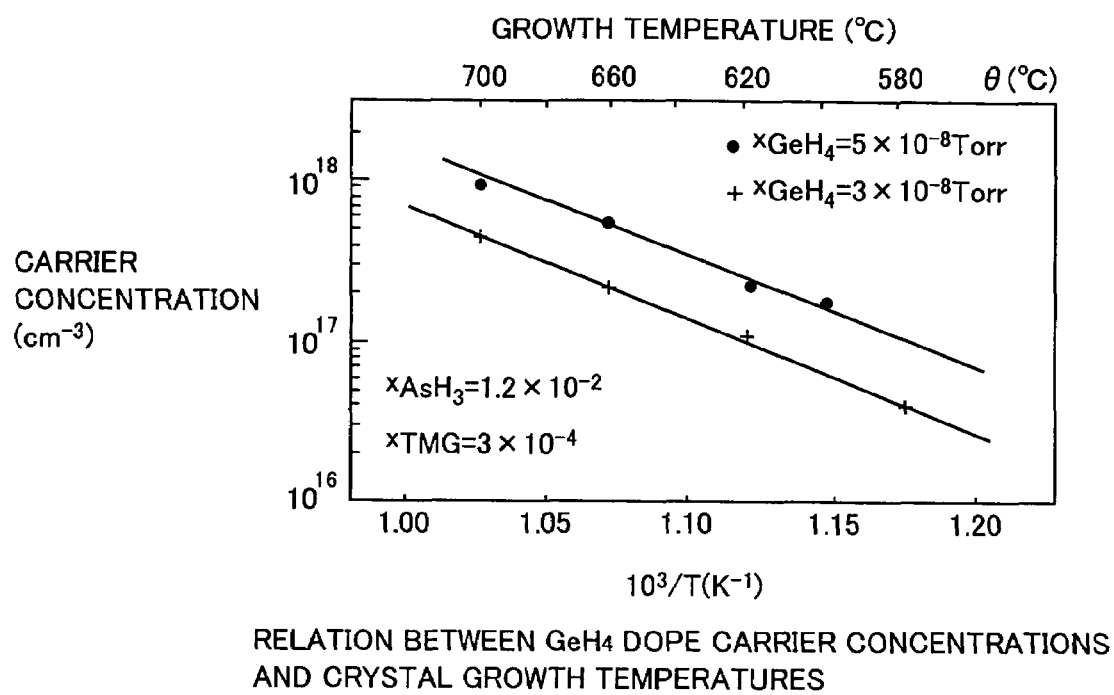
FIG. 7 is a graph showing the relation between carrier concentrations of $GeH_4$ dope and crystal growth temperatures.

In Example 1, it has been described that the laser irradiation portion attains p-type. However, the laser irradiation portion attained n-type by using DMZ (dimethyl zinc) shown in FIG. 4 as the p-type carrier material gas and using $SiH_4$ shown in FIG. 6 or $GeH_4$ shown in FIG. 7 as the n-type carrier material gas. It is noted that FIGS. 4, 6 and 7 are graphs each showing the relation between the carrier concentrations represented on the axis of ordinate and the crystal growth temperatures on the axis of abscissa.

Example 3

Figure 2A:
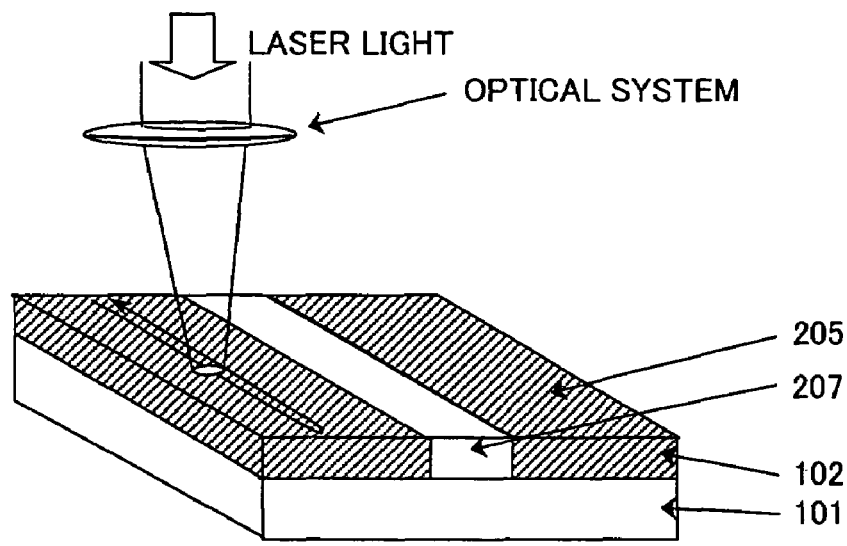
FIGS. 2A–2C are perspective views showing another stacked structure of a semiconductor laser device during crystal growth, where
Figure 2B:
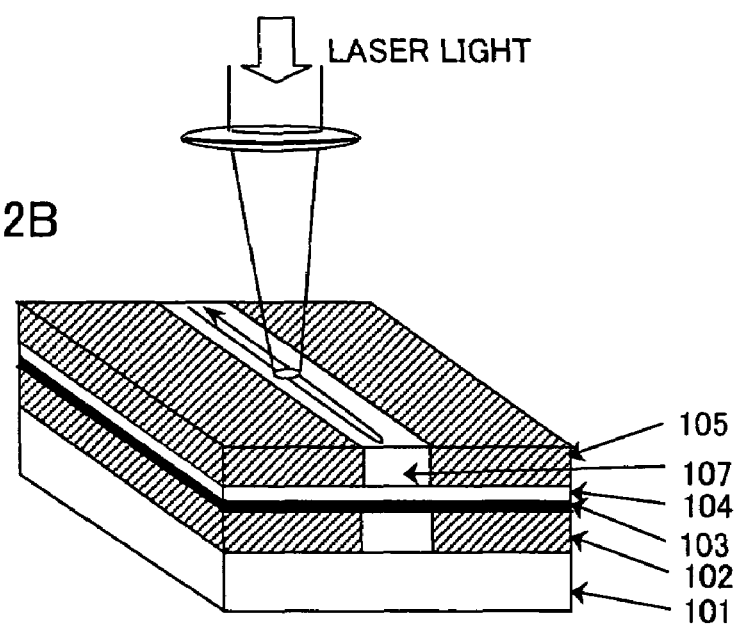
Figure 2C:
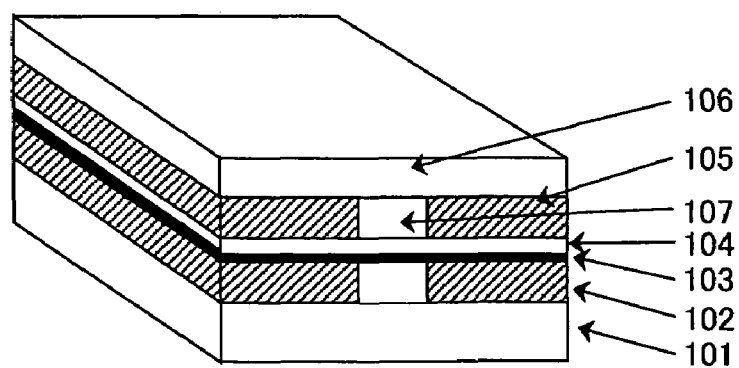

Example 3 will be described with reference to FIGS. 2A–2C. FIGS. 2A–2C are perspective views showing a stacked structure of a semiconductor laser device during crystal growth, including substrate 101, n-cladding layer 102, active layer 103, p-cladding layer 104 (an inner layer of the cladding layer), current narrowing portions 105, 205, p-semiconductor layer 106, stripe portions 107, 207 different in conductivity type from adjacent portions, each forming a channel portion (a current path). It is noted that the cladding layer (an outer layer of the cladding layer) formed on the outer side of p-cladding layer 104 is constituted with current narrowing portion 105 and stripe portion 107 different in conductivity type from adjacent portions.

In this example, using as raw materials, n-type GaAs substrate 101 doped with Si ($2\times10^8$ $cm^{-3}$), arsine, trimethyl gallium (TMG) and trimethyl aluminum (TMA), with the application of the method for use in the growth of the channel portion (stripe portion 107) in Example 1 to the crystal growth of n-cladding layer 102, the portion (i.e. current narrowing portion 205) other than the portion opposed to the channel portion (stripe portion 107) was irradiated with laser light to attain n-type or p-type with a carrier concentration of $1\times10^{17}$ $cm^{-3}$ or lower. Here, the portion (i.e. stripe portion 207 forming the channel portion) opposed to the channel portion (i.e. stripe portion 107) is not irradiated with laser light to be kept at a low temperature, and with a such temperature setting that results in n-type with a carrier concentration of approximately $1\times10^{18}$ $cm^3$, n-cladding layer 102 was grown. Current narrowing portion 205 in cladding layer 102 was grown under the same conditions as Example 1 (FIG. 2A). It is noted that $H_2Se$ was used as the carrier material gas. Thus, n-cladding layer 102 includes current narrowing portion 205 and stripe portion 207 different in conductivity type from adjacent portions.

Thereafter, active layer 103, p-cladding layer 104, current narrowing portion 105, a channel portion (stripe portion 107 different in conductivity type from adjacent portions), and p-semiconductor layer 106 were deposited on n-cladding layer 102 by the same method as Example 1 (FIG. 2B). The semiconductor laser device shown in FIG. 2C was thus manufactured. The resultant semiconductor laser device has a higher resistance in the low carrier concentration portion, so that current spread only occurs to the extent of the width of the channel portion, thereby resulting in a high efficient laser.

It is noted that the channel portion (stripe portion 207 different in conductivity type from adjacent portions) in n-cladding layer 102 as described above could be irradiated with laser light during crystal growth. Alternatively, a cladding layer (corresponding to layer 104 (the inner layer of the cladding layer) above the active layer) having a uniform carrier concentration could be provided under active layer 103 by adjusting the conditions of the laser light radiation and the crystal growth temperature.

In the semiconductor laser device in accordance with the present invention, the channel portion and the current narrowing portion can easily be formed, without a pattern forming step (including the steps of forming a pattern mask, etching process, removing the pattern mask, and the like), by utilizing different absorption rates of carrier material gas into the cladding layer depending on the crystal growth temperature and varying the carrier concentrations in the cladding layer during crystal growth. Furthermore, the channel portion and the current narrowing portion can be formed in a single crystal growth step, whereby the manufacturing efficiency can significantly be improved and a variety of semiconductor characteristics such as electrical and optical characteristics can also be improved. In addition, the characteristic variations between products can be prevented. The formation of the current narrowing portions both in the p-cladding layer and the n-cladding layer results in a high efficiency and realizes lower power consumption and higher power. The semiconductor laser device of the present invention is applicable to an optical integrated circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device having a pair of cladding layers with an active layer interposed therebetween, wherein at least one of the cladding layers is of the same composition through an entire region of the cladding layer, excluding a dopant in the cladding layer, and has a stripe portion different in conductivity type from adjacent portions, and said stripe portion different in conductivity type from adjacent portions is formed by using at least two carrier material gases having different absorption rates into said cladding layer at a prescribed temperature and different conductivity types, and by creating a temperature distribution of crystal growth temperatures of said cladding layer.

2. The semiconductor laser device according to claim 1, wherein said stripe portion different in conductivity type from adjacent portions forms a channel portion or a current narrowing portion.

3. The semiconductor laser device according to claim 1, wherein when said snipe portion different in conductivity type from adjacent portions is formed in each cladding layer, said stripe portions are opposed to each other with said active layer interposed therebetween.

4. The semiconductor laser device according to claim 1, wherein said temperature distribution is created by laser radiation in the form of a stripe portion.

5. The semiconductor laser device according to claim 1, wherein said temperature distribution is created by scanning with laser light.

6. The semiconductor laser device according to claim 1, wherein all layers in said semiconductor laser device are flat.

7. The semiconductor laser device according to claim 1, wherein when said cladding layer is formed of two layers of separate inner and outer layers, said stripe portions different in conductivity type from adjacent portions are opposed to each other with both of said active layer and the inner layer of the cladding layer interposed therebetween.

8. A semiconductor laser device having a pair of cladding layers with an active layer interposed therebetween, wherein each cladding layer is of the same composition through an entire region of the cladding layer, excluding a dopant in the cladding layer, and has a snipe portion different in conductivity type from adjacent portions, and at least one of said cladding layers is formed of two layers of separate inner and outer layers, and said stripe portions different in conductivity type from adjacent portions are opposed to each other with both of said active layer and the inner layer of die cladding layer interposed therebetween.

9. The semiconductor laser device according to claim 8, wherein said stripe portion different in conductivity type from adjacent portions forms a channel portion or a current narrowing portion.

10. The semiconductor laser device according to claim 8, wherein all layers in said semiconductor laser device are flat.

* * * * *

UNITED STATES PATENT AND TRADEMARK OFFICE
CERTIFICATE OF CORRECTION

PATENT NO. : 7,046,708 B2 Page 1 of 1
APPLICATION NO. : 10/716221
DATED : May 16, 2006
INVENTOR(S) : Syuzo Ohbuchi It is certified that error appears in the above-identified patent and that said Letters Patent is hereby corrected as shown below:

In the Claims:

Claim 3, column 8, line 11, please replace "snipe" with --stripe--.

Claim 8, column 8, line 33, please replace "snipe" with --stripe--.

Claim 8, column 8, line 39, please replace "die" with --the--.

Signed and Sealed this

Twenty-third Day of January, 2007

JON W. DUDAS
*Director of the United States Patent and Trademark Office*